United States Patent [19]

Beece et al.

[11] Patent Number: 4,914,612

[45] Date of Patent: Apr. 3, 1990

[54] MASSIVELY DISTRIBUTED SIMULATION ENGINE

[75] Inventors: Daniel K. Beece, Carmel; Monty M. Denneau, Brewster; Peter H. Hochschild, New York; Allan Rappaport, New Hempstead; Cynthia A. Trempel, Pleasantville, all of N.Y.

[73] Assignee: International Business Machines Corporation, Armonk, N.Y.

[21] Appl. No.: 175,879

[22] Filed: Mar. 31, 1988

[51] Int. Cl.⁴ .......................... G06F 9/02; G06F 13/20
[52] U.S. Cl. ................................. 364/578; 364/933.8; 364/942.05
[58] Field of Search ................... 364/578, 200, 900

[56] References Cited

U.S. PATENT DOCUMENTS

| | | | |
|---|---|---|---|
| 4,306,286 | 12/1981 | Cocke et al. | 364/200 |
| 4,527,249 | 7/1985 | Van Brunt | 364/578 |
| 4,633,417 | 12/1986 | Wilburn et al. | 364/578 |
| 4,697,241 | 9/1987 | Lavi | 364/488 |
| 4,725,970 | 2/1988 | Burrows et al. | 364/578 |
| 4,763,288 | 8/1988 | Deering et al. | 364/578 |
| 4,763,289 | 8/1988 | Barzilai | 364/578 |

OTHER PUBLICATIONS

Pfister, "The Yorktown Simulation Engine", ACM IEEE 19th Design Automation Conference Proceedings, 1982, pp. 51–64.

Ohno et al., "Principles of Design Automation ...", 23rd Design Automation Conference Proceedings, 1986, pp. 354–359.

Koike et al., "HAL: A High-Speed Logic Simulation Machine", IEEE Design & Test, Oct. 1985, pp. 61–73.

Blank, "A Survey of Hardware Accelerators Used in Computer-Aided Design", IEEE Design & Test, Aug. 1984, pp. 21–39.

Beece et al., "The IBM Engineering Verification Engine", Information Processing of Soc. of Japan, Jun. 10, 1987.

Primary Examiner—Felix D. Gruber
Attorney, Agent, or Firm—Sughrue, Mion, Zinn, Macpeak & Seas

[57] ABSTRACT

A simulation engine for logically simulating a logic network, which is divided into several levels of hierarchy. At the lowest level is a logic chip which has stored in an instruction memory a sequentially executed program of logical operators and operand addresses. The operand addresses refer to an input memory of the chip. The next highest level is the logic unit, on one circuit board, comprising a plurality of such logic chips. Each of the logic chips of the unit has its input memory receiving the same data from an input bus and a local bus and provides as its output one of the bits of an output bus and one of the bits of the local bus. At the next level, called a cluster, several logic units have their input and output buses interconnected by a plurality of switch units. All the logic chips of the several logic units operate in parallel with the exchange of data through the switch units. Several clusters can be combined into a super cluster by connecting together two or more sets of switch units.

12 Claims, 12 Drawing Sheets

U.S. Patent   Apr. 3, 1990   Sheet 1 of 12   4,914,612
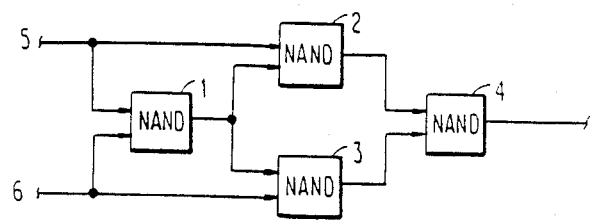
FIG. 1
PRIOR ART
FIG. 2
PRIOR ART
| ADDRESS | FUNCTION | ADR1 | ADR2 | ADR3 | ADR4 |
|---|---|---|---|---|---|
| 1 | NAND | 5 | 6 | | |
| 2 | NAND | 5 | 1 | | |
| 3 | NAND | 1 | 6 | | |
| 4 | NAND | 2 | 3 | | |
FIG. 3
PRIOR ART
MINOR CYCLE
| ADDRESS | 1 | 2 | 3 | 4 |
|---|---|---|---|---|
| 1 | * | 1 | 1 | 1 |
| 2 | * | 1 | 1 | 1 |
| 3 | * | * | 0 | 0 |
| 4 | * | * | * | 1 |
| 5 | 0 | 0 | 0 | 0 |
| 6 | 1 | 1 | 1 | 1 |
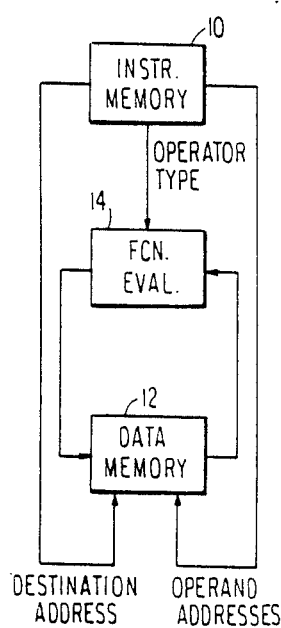
FIG. 4
PRIOR ART
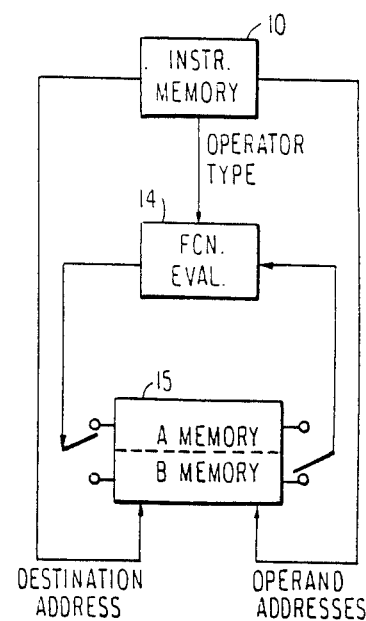
FIG. 8
PRIOR ART

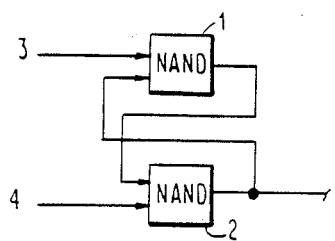
FIG.5
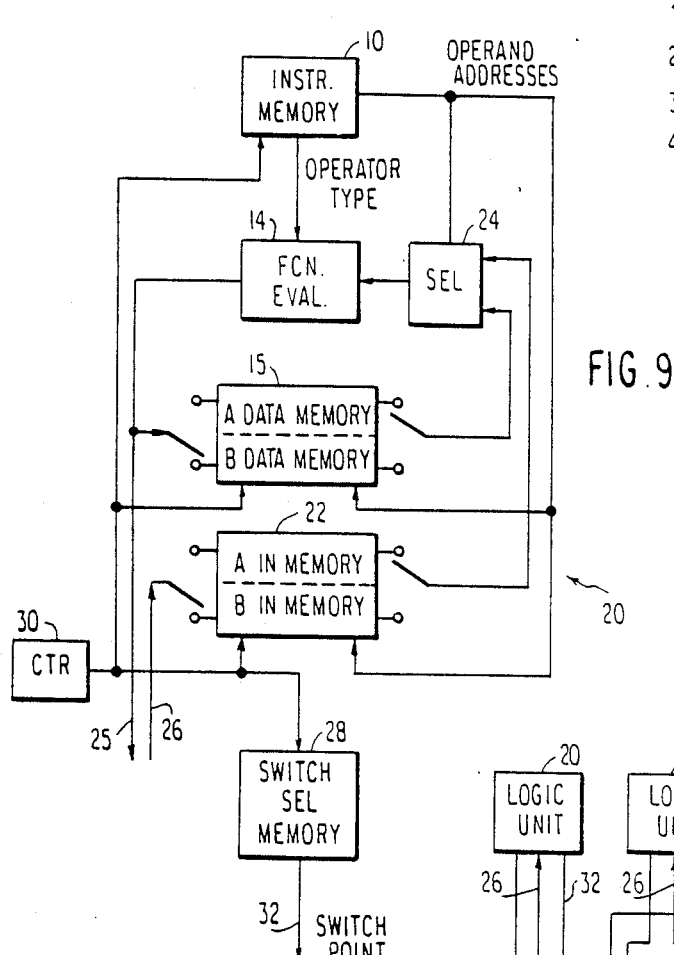
FIG.6
FIG.7
FIG.9
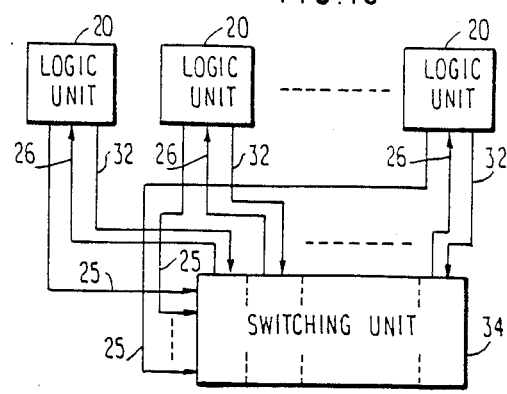
FIG.10

IM:
| FTAB | FCTL | WAIT | OP1 | OP2 | OP3 | OP4 | OP5 |
|---|---|---|---|---|---|---|---|
| 16 | 12 | 7 | 7+1+d | 7+1+d | 7+1+d | 7+1+d | 7+1+d |

IM:
| FTAB | FCTL | WAIT | OP1 | OP2 | OP3 | OP4 | OP5 | OP6 |
|---|---|---|---|---|---|---|---|---|
| 16 | 12 | 7 | 7+i | 7+i | 7+i | 7+i | 7+i | 1+o |

FIM:
| FTAB | FCTL | WAIT | OP1 | OP2 | OP3 | OP4 |
|---|---|---|---|---|---|---|
| 16 | 12 | 7 | 7+i | 7+i | 7+i | 7+i |

OIM:
| OP5 | OP6 |
|---|---|
| 7+i | 1+o |

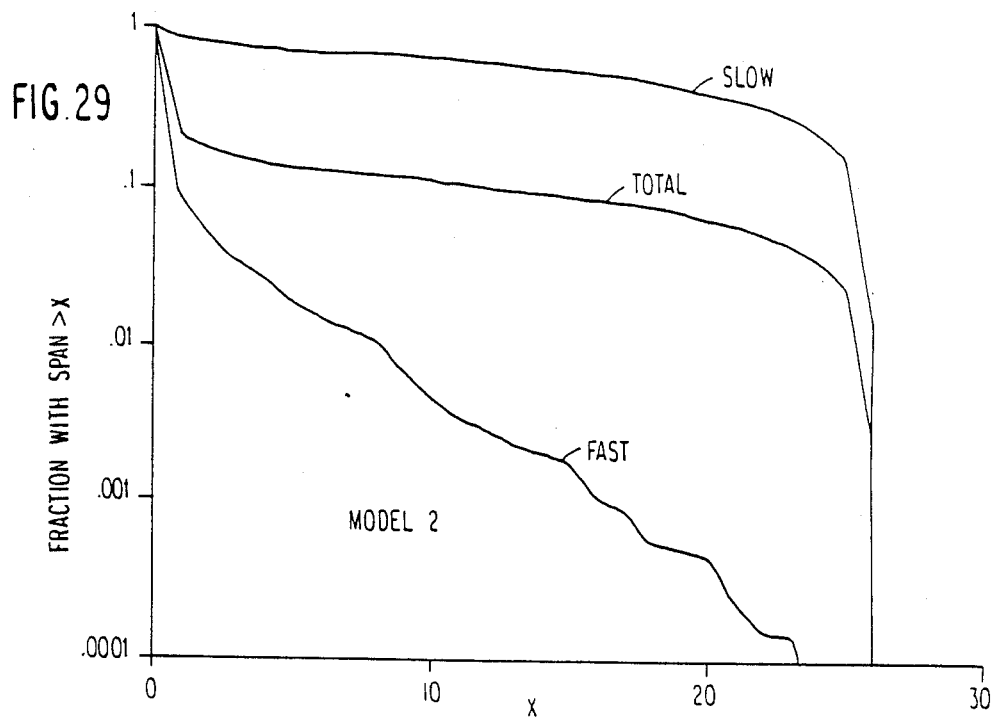
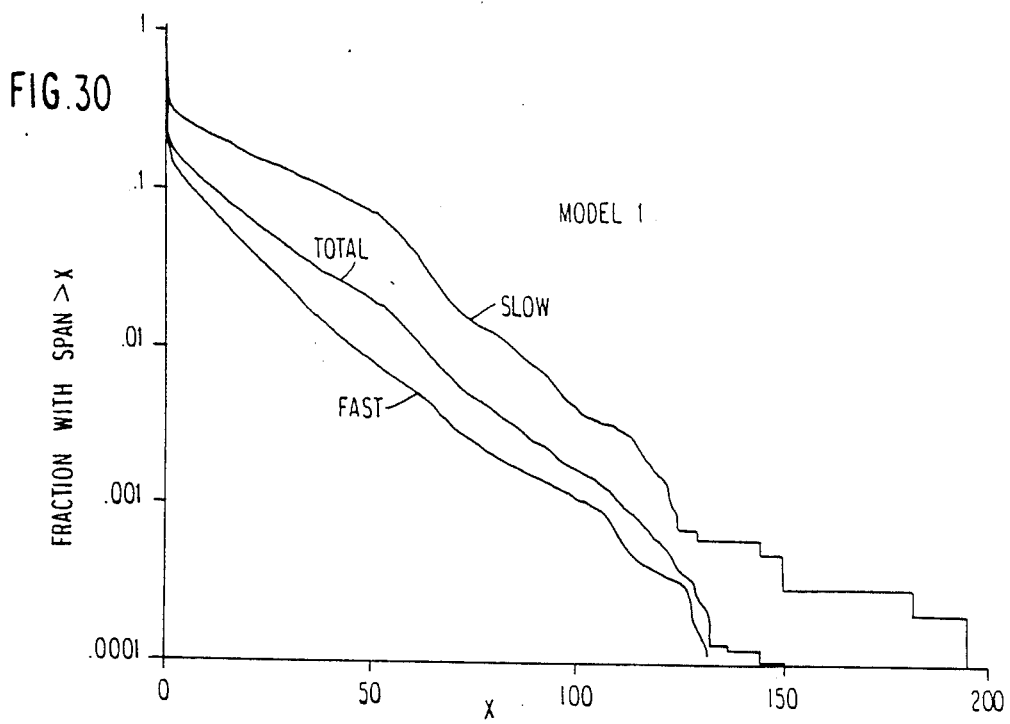

MASSIVELY DISTRIBUTED SIMULATION ENGINE

BACKGROUND OF THE INVENTION

1. Field of the Invention

This invention relates to simulation of logic systems. In particular, it relates to the high-speed simulation of logic circuits by a large number of parallel, specialized processing units.

2. Background Art

Logic circuits in computer systems and related products have become increasingly large and complex. As a result, the initial design and fabrication have become increasingly more lengthy and costly. Although many efforts are made to eliminate any errors, it is no longer feasible to test the design only after the circuit has been fabricated. Accordingly, in recent Years there has been increasing effort in design verification using computer modeling of the logic circuits before the circuit is actually embodied in hardware. The errors being referred to here is the interaction of logic circuits which are assumed to be operating correctly as separate entities but which may producing poor or incorrect results in total.

Simulation has become a central part of verification methodology for circuit design. Applications span a wide spectrum, from early specifications to explore different architectural possibilities to the final stages of manufacturing test generation and fault coverage evaluation. For a long time, computer programs for use on a general purpose computer have been known which simulate such logic circuits. However, as the number of gates on a single chip have reached into the range of hundreds of thousands to millions, these purely software simulators have required excessive amounts of computer time. For example, Hitachi has stated in the 23rd (1986) Design Automation Proceedings that 85% of the computer time used in the design of the M-68X high-end mainframe was spent on design verification. See Ohno et al, "Principles of Design Automation System for Very Large Scale Computer Design", pages 354–359. Equally important, the ability to fully simulate a design often has significant impact on product schedule.

One approach used to overcome the excessive resource problem for full system simulation has been to build a hardware model of the design, essentially by hand wiring circuit boards with discrete components. Once wired, the circuit very quickly can emulate the desired circuit. Obviously however, a hardware model itself is costly and time consuming to build.

Another approach, which has found widespread acceptance, is a specialized logic simulation machine, referred to here as a simulation engine. There are numerous hardware machines in existence for simulation, with different capacity, performance and applications. A survey is provided by Blank in a technical article entitled "A Survey of Hardware Accelerators Used in Computer-Aided Design" appearing in IEEE Design and Test of Computers, February 1984, at pages 21–38. At one end, there are work station co-processors, such as the Sprintor from the Zycad Corporation of Minneapolis, Minnesota, which can be a cost effective simulation alternative for relatively small systems, up to a maximum of a few tens of thousands of logic gates, running a small volume of simple test cases. At the other end, there are special main frame attached processors for applications significantly larger than one million gates. Typically these large machines run long, complex architectural level (i.e., assembly language) programs. Examples of such high end processors are SDE from Zycad, the HAL from NEC and the Yorktown Simulation Engine from IBM. The HAL is described by Koike et al in an article entitled "HAL: A High-Speed Logic Simulation Machine" appearing in IEEE Design & Test, October 1985 at pages 61–73. The Yorktown Simulation Engine is described by Denneau in a technical article entitled "The Yorktown Simulation Engine" appearing in ACM IEEE 19th Design Automation Conference Proceedings, 1982, by Kronstadt et al in an article entitled "Software Support for the Yorktown Simulation Engine" appearing in the same proceedings and by Pfister in an article entitled "The Yorktown Simulation Engine Introduction" also appearing at pages 51–64 in the same proceedings. Beece et a described EVE, a production level development of the Yorktown Simulation Engine in a paper entitled "The IBM Engineering Verification Engine" published by the Information Processing Society of Japan on June 10, 1987.

A similar simulation engine is described by Cocke et al in U.S. Pat. No. 4,306,286. The principles of operation of the Yorktown Simulation Engine, which is based on that patent, will now be described. Note the description will be somewhat simplified but should illustrate how the basic simulation paradigm operates.

Consider the logic circuit of FIG. 1. This circuit consists of four NAND gates labelled by their outputs: 1, 2, 3 and 4. There are two inputs to the circuit, labelled 5 and 6, and the one output of the circuit is the output of NAND gate 4. Note that the label of each gate is also used to label its output state or net.

In the Yorktown Simulation Engine, each gate, in this case the four NAND gates, are represented as words in what is called an "instruction memory" (See FIG. 2). The state of every net in the circuit, including the gate outputs and circuit inputs, are represented in what is called a "data memory" (see FIG. 3). Note that there is a one-to-one correspondence between the locations of the data memory and the instruction memory, that is, the first instruction memory location contains NAND gate 1 and the first data memory location contains the output of NAND gate 1, etc. The fields of the instruction memory define the function of each gate, in this case all NANDs, and which nets are used as inputs for the gate, specified by the address in the data memory of the appropriate nets. For example, addresses 5 and 6 in the $ADR_1$ and $ADR_2$ fields of the instruction memory at address 1 indicate that nets 5 and 6 are inputs to gate 1.

The operation of the Yorktown Simulation Engine is very simple: Each instruction is executed in order, without branches The evaluation of a single instruction, called a "minor cycle", consists of fetching the specified operands from the instruction memory, performing the indicated logical operand (in this case, always NAND), and then storing the resultant operand back into the data memory. The single evaluation all instructions in sequence, that is, a single pass through the contents of the instruction memory, is called a "major cycle".

In FIG. 3, the different columns show state of the data memory of FIG. 2 after each minor cycle. Values which are undefined (uninitialized) at a given time are shown by a "*". Note that because the gates were rank-ordered, a single pass was sufficient to provide the correct circuit output.

The process just described is well known. What differentiated the Yorktown Simulation Engine was the computational mechanism, illustrated in FIG. 4. This computing system will be called a logic unit. An instruction memory 10 is programmed with the program illustrated in FIG. 2. A data memory 12, corresponding to FIG. 3, is initially loaded with the circuit input values, inputs 5 and 6 in the example. A function evaluator 14 performs the actual evaluation of the instructions. That is, the instructions in the instruction memory 10 are sequentially executed. The operator type is sent to the function evaluator 14. The four operand addresses $ADR_1$-$ADR_4$ are sent to the data memory 12 which then sends the values of the four operands to the function evaluator 14. The function evaluator 14 evaluates the function according to the logic type and sends the result back to the data memory 12, where it is stored at the destination address corresponding to that instruction. In the program of FIG. 2, the destination address is equal to the instruction number. Thereafter, the succeeding instruction is executed in the same way. Because of a limited number of logic types and of operand values, the function evaluator 14 can be implemented by a memory, addressed by the operator type and operand values. That is, the computing system of FIG. 4 is very simple and can be made to operate very fast.

The logic circuit presented as an example in FIG. 1 is unduly simple since it does not allow for feedback in the circuit. For instance, the circuit shown in FIG. 5 has the very simple instruction program shown in FIG. 6. However, because of feedback this program needs to operate a number of times since on the first major cycle some of the gate inputs are undefined. Even on subsequent major cycles some outputs have not assumed stable values. The data memory is shown by the columns of FIG. 7, which unlike FIG. 3 shows the data values only at the end of each major cycle of executing all the instructions.

An important point is that undefined values need to be explicitly represented so that two bits are required to represent a single bit of data. Another point is that an undefined input can sometimes produce a defined output. For instance, in the first major cycle, NAND gate output 1 was produced from a high input and an undefined input. Regardless of the value of the undefined input, the output 1 is still a low.

The simulation for the circuit of FIG. 1 is called a rank-ordered simulation because the ordering of the gates is crucial. The multiple major cycle simulation for the circuit of FIG. 5 is called a unit-delay simulation for the following reasons. The speed of the unit-delay simulation can be increased by the use of an A/B data memory 15, as shown for the logic unit in FIG. 8. Such an A/B data memory 15 has replicated halves. On one major cycle, one of the halves, say the A half, serves as the source of operand values while the B half serves as the destination of the instruction results. On the next major cycle, the roles of the A and B halves are reversed. The advantage of an A/B memory 14 is that the fetching of the next set of operand values does not have to await the storing the instruction result from the previous instruction That is, the operation can be made highly pipelined and the cycle time can be the unit delay of the logic and memory used in the simulation engine.

The power of the simulation engine can be markedly increased if there is replication of the simulation engines shown in FIG. 8. The problem arises, however, that a larger circuit cannot be broken down into smaller circuits which do not interact. That is, there must be provided communication between the logic units to exchange the results of the gate function evaluations. A plurality of parallel logic units 20, each illustrated in FIG. 9, provide such communication across a switch unit illustrated in FIG. 10.

The logic unit 20 is similar to that described before. However, the operand address must be expanded so that it can refer either to locally generated data, generated in the same logic unit 20 and stored in the data memory 14, or to data generated in another logic unit 20 but stored in an A/B input memory 22. The operand addresses must be provided to a four-section data selector 24 so that only four data values are presented to the function evaluator 14. The result of the logic evaluation is stored in the data memory 14 and is also presented to the switch unit on an output data line 25. Simultaneously, the switch unit is presenting data on an input data line 26 to this logic unit 20, which data has originated from some other logic unit. This data is stored in the input memory 22. A switch select memory 28 is stored with the designations of other logic units 20 from which data is to be obtained. The logic unit designation is provided to the switch unit on a switch point line 32. The instruction memory 10, the data receiving parts of the data memory 14 and of the input memory 22 and the switch select memory 28 are synchronously addressed by a counter 30. Therefore, on the n-th minor cycle, the n-th instruction in the instruction memory 10 is executed and the result is presented both to the data memory 14 and to the switch unit via the output data line 25. Then also the n-th location of the data receiving part of the input memory 22 receives data on the data input line 26 via the switch unit from the logic unit 20 designated by the n-th location of the switch select memory 28.

The switch unit 34, illustrated in FIG. 10, is a crosspoint switch receiving the data output lines 25 from all the switches in the horizontal direction and selectively connecting them to the data input lines 26 in the vertical direction The switch points in each column are controlled by one of the switch point lines 26. Therefore, one of the data output lines 25 can be connected to more than one of the data input lines 26.

The above description is incomplete and a complete understanding of the circuitry and operation of the simulation engine requires reference to the Cocke et al patent and the Yorktown Simulation Engine papers.

The Cocke et al simulation engine offers a potential increase in speed of N, where N is the number of logic units operating in parallel. Furthermore, because of the A/B memories and statically configured connectivity, the inter-unit communication does not severely affect the speed of the individual units.

However, there are limitations to the Cocke et al simulation engine. The total capacity of the machine is the product of the number of gates simulated per logic unit times the number of logic units in the machine. The performance of the machine is determined by the number of gates simulated per logic unit. Since the interconnection network of the machine is an NxN cross-point, which have limited size, the total number of processing units is limited. Once the maximum sized switch has been built in a given technology 256 or 512 at present, the only way to increase capacity degrades performance. The Cocke et al simulation engine further is limited in the interconnectivity of the circuits simulated by each of the separate logic units. A logic unit can receive only one data value from any other processor for each minor cycle. Therefore, each logic unit can have on average only one operand per instruction which originates from another logic unit. As the number of logic units increases, this condition becomes more difficult to satisfy.

Therefore, although the Cocke et al simulation engine offers greatly increased speed, its fundamental limitations are being pressed by current levels of size and complexity in logic systems.

SUMMARY OF THE INVENTION

Accordingly, an object of the invention is to provide a logic simulation engine which can simulate a large number of logic gates.

Another object of the invention is to provide a logic simulation engine which can transmit large amounts of data between parallel processing units.

Yet another object of the invention is to provide a logic simulation engine which allows for a high degree of parallel operation.

The invention can be summarized as a logic simulation engine in which logic units are composed of a large number of small logic processors operating in parallel and communicating over a local data bus. Each of the logic units is additionally connected to other logic units via a switching system. Separate input and output lines connect each of the logic chips to the switching system so that there is high bandwidth of information interchange between the logic units. Furthermore, a substantial number of the above systems can be interconnected in parallel via a central switch.

BRIEF DESCRIPTION OF THE DRAWINGS

FIG. 1 is an example of a logic circuit to be simulated.

FIGS. 2 and 3 are respectively a set of instructions and a data table used in simulating the logic circuit of FIG. 1.

FIG. 4 is a block diagram of one type of logic unit used in performing a simulation.

FIG. 5 is an example of another logic circuit having feedback.

FIGS. 6 and 7 are are respectively a set set of instructions and a data table used in simulating the logic circuit of FIG. 5.

FIG. 8 is a block diagram of another type of logic unit used in performing a simulation.

FIG. 9 is a block diagram of yet another type of logic unit used in a multi-unit simulator.

FIG. 10 is a block diagram of a switch unit used with the logic unit of FIG. 9.

FIGS. 28 and 29 are graphs of the distribution of unpartitioned span for the two models.

FIGS. 30 and 31 are graphs of the partitioned span for the two models.

DETAILED DESCRIPTION OF THE PREFERRED EMBODIMENTS

Figure 11:
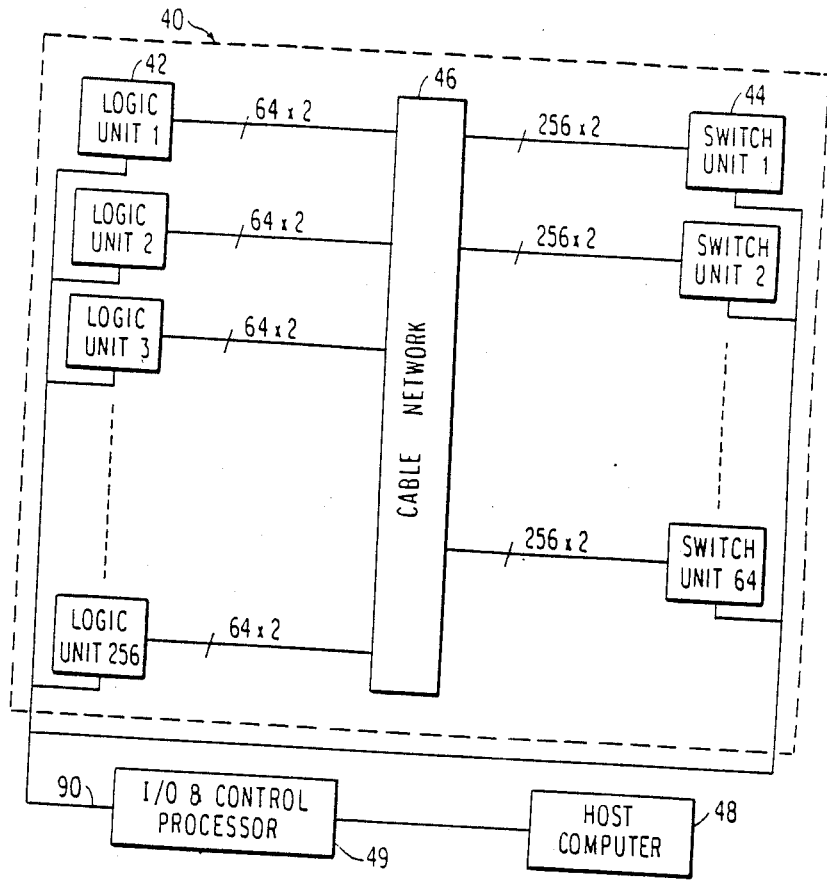
FIG. 11 is a block diagram of a single cluster embodiment of the simulation engine of the present invention.

The present invention relies upon a hierarchy of processing levels to accomplish a greater degree of parallel processing. The three levels to be discussed here are, from the lowest to the highest, a logic chip, a logic unit and a cluster. In the initial discussion, only a single cluster 40 will be described, as shown in FIG. 11. The cluster comprises a plurality of logic units 42 and a plurality of switch units 44 connected by a cable network 46. For instance, there are 256 logic units 42 and 64 switch units 44. It is intended that each of the logic units 42 and each of the switch units 64 be embodied in a printed circuit board so that the terminology logic board and switch board may be used. A host computer 48 of the power of a System 370 runs the system through an I/O and control processor 49. Cabling between the logic units 42 and the switch units 44 are arranged in twisted pairs of signal and ground. The logic units 42 perform the simulation calculations in parallel and the switch units 44 provide selective interchange of information between the logic units 42. The cable network 46 consists of fixed cabling which can be extensive in view of the large number of boards. In some of the embodiments, one or more of the logic units 42 can be replaced by array units, to be described later.

Figure 12:
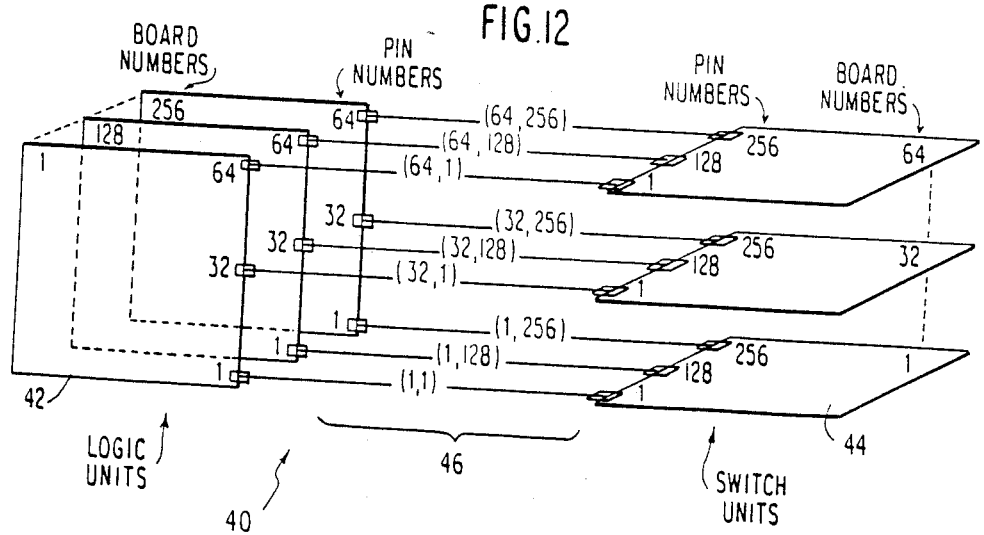
FIG. 12 is a pictorial illustration of the cabling in the simulation engine of FIG. 11.

The board-like nature of the cluster 40 and the cabling is made clear in FIG. 12. Each of the 256 logic units 42 have 128 connections (64 inputs and 64 outputs) and each of the 64 switch units 44 have 512 connectors (256 inputs and 256 outputs). In the described embodiment, only one data bit is assigned to each logic bit so that undefined states are not explicitly represented, although the alternative of 2 data bits per logic bit is also possible. A like-numbered pin on each of the logic units 42 is connected by a respective twisted-pair cable to a respective pin on a like-numbered one of the switch units. Therefore, each of the logic units 42 is connected to each of the switch units 44. The individual twisted-pair cables in the cable network 46 are labelled by (i, j), where the (i, j)-th cable connects the i-th pin on the j-th logic unit 42 with the j-th pin on the i-th switch unit 44. The number of pins on the logic units 42 equals the number of switch units 44 while the number of pins on the switch units 44 equals the number of logic units 42. Therefore, each of the logic unit 42 has 64 inputs and 64 outputs while each of the switch units 44 has 256 inputs and 256 outputs. The above mentioned numbers are generally attainable in present technology although factor of two variations can be expected in building optimal simulation engines. Compared to the prior art of FIG. 10, the simulation engine of FIGS. 11 and 12 provides increased bandwidth between logic units of a factor of 64 if it is assumed that the cycle times of the machines are the same.

Figure 13:
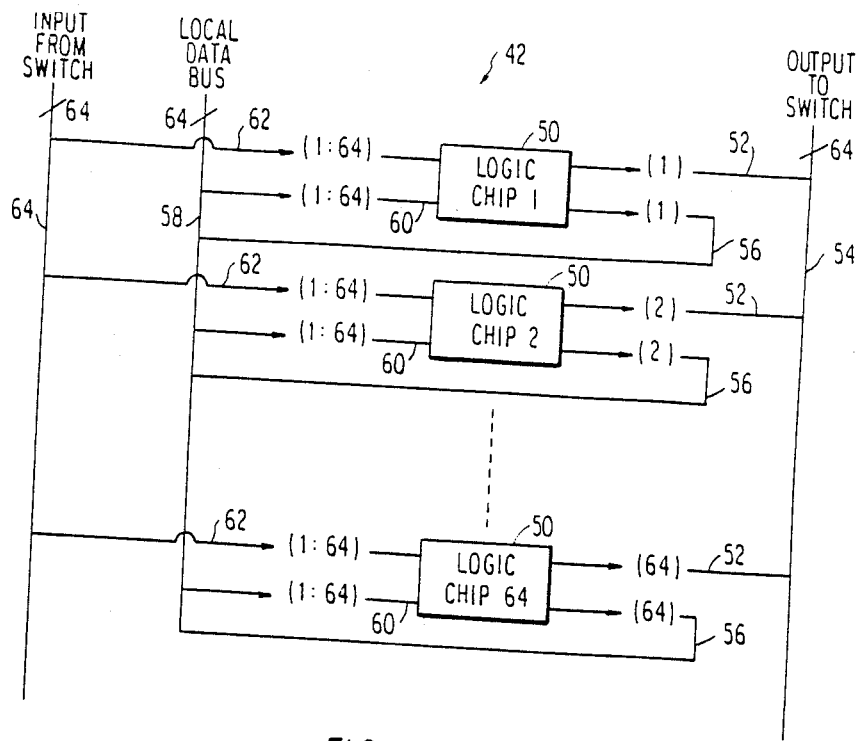
FIG. 13 is a block diagram of a logic unit of FIG. 11.

The structure of each logic unit 42 is illustrated in FIG. 13 and primarily consists of 64 logic chips 50. A logic chip 50 corresponds generally to the prior art logic unit 20 of FIG. 9 although there are important differences. Each logic chip 50 is intended to be a single integrated circuit although it is preferred that multiple integrated circuits be incorporated into a single module for durability and packaging density. Each logic chip 50 has one switch data output 52 which is combined into a switch output bus 54 connected to respective pins of the logic unit 42. Each logic chip 50 additionally has one local data output 56 which is combined into a local data bus 58. Each logic chip 50 has 64 local data inputs 60 derived from the local data bus 58 so that that logic chip 50 receives its own local data output and those of all other logic chips 50 on the logic unit 42. Each logic chip 50 finally has 64 switch data inputs 62 derived from a 64-bit wide switch data bus 64. Each of the lines in the switch data bus 64 is connected to one of the pins of the logic unit 42. Therefore, each logic chip 50 provides switch output data to one of the logic unit pins but receives all the switch input data from each of the pins and all of the local data from all of the logic chips 50 on that logic unit 42.

Figure 14:
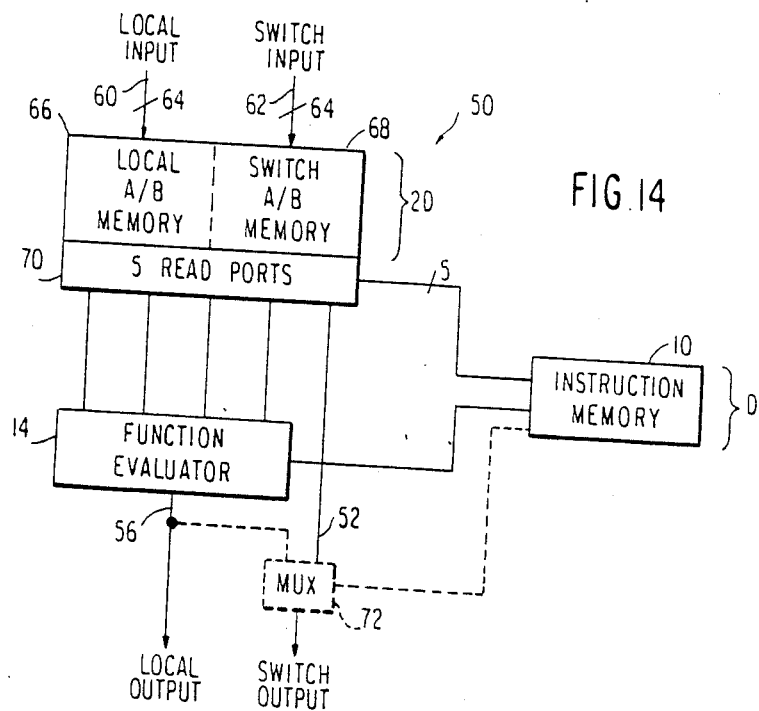
FIG. 14 is a block diagram of a first embodiment of a logic chip of FIG. 13.

Without going into particulars at this point, the n-th switch unit 44 provide for interchange of data between the n-th numbered logic chips 50 on all logic units 42 to all logic chips 50 in a selected one or more logic units 42. The structure of one embodiment of the logic unit is shown in FIG. 14. The instruction memory 10 and the function evaluator 14 are similar to the prior art although the preferred embodiments are somewhat different. The 64 bits of local input data on the local data bus 60 are read into a local A/B memory 66 in parallel. Similarly, the 64 bits of switch input data on the switch data input bus are read into a switch A/B memory 68 in parallel. Five read ports 70 can read any five values in the memories 66 and 68, as addressed by four operands and one transmission source address in the current instruction in the instruction memory 10. One method of providing five read ports to the memories 66 and 68 is to provide five parallel memories all containing the same data and outputting according to five respective memory addresses to the respective read ports.

The preferred addressing structure for the memories 66 and 68 for a simulation depth of D is to provide each memory 66 and 68 with 2D separately addressable locations. The depth D could, for example, be 64. An additional high order bit in the address will then be set depending on whether the A half or the B half is being currently accessed. However, the possibility remains of reading from the "wrong" half by so setting the high order bit. Normally, however, a counter simultaneously controls the fetching of one of the N instructions in the instruction memory 10 and the storing of data in the A/B memories 66 and 68.

The four bits of binary data provided to the function evaluator 14 by 4 of the 5 read ports 70 is evaluated according to the function type provided by the instruction memory 10. The previously described embodiment of the function evaluator 14 used the function type for a high order address in a ROM (or RAM) and the data inputs for a low order address. However, the ROM and the access time to it can be eliminated by replacing the function type in the instruction memory 10 by the complete 16 bit function table for that function. The complete function table for the current instruction is then transferred into the function evaluator 14 and the one desired bit in the table is addressed by the four data values input to the function evaluator 14. Thereby, $2^{16}$ possible functions can be programmed.

A possible improvement to the logic chip 50 is to provide a multiplexer 72 controlled by the current instruction from the instruction memory 10 so that the current output of the function evaluator 14 can be immediately sent to the switch units 44.

Figure 15:
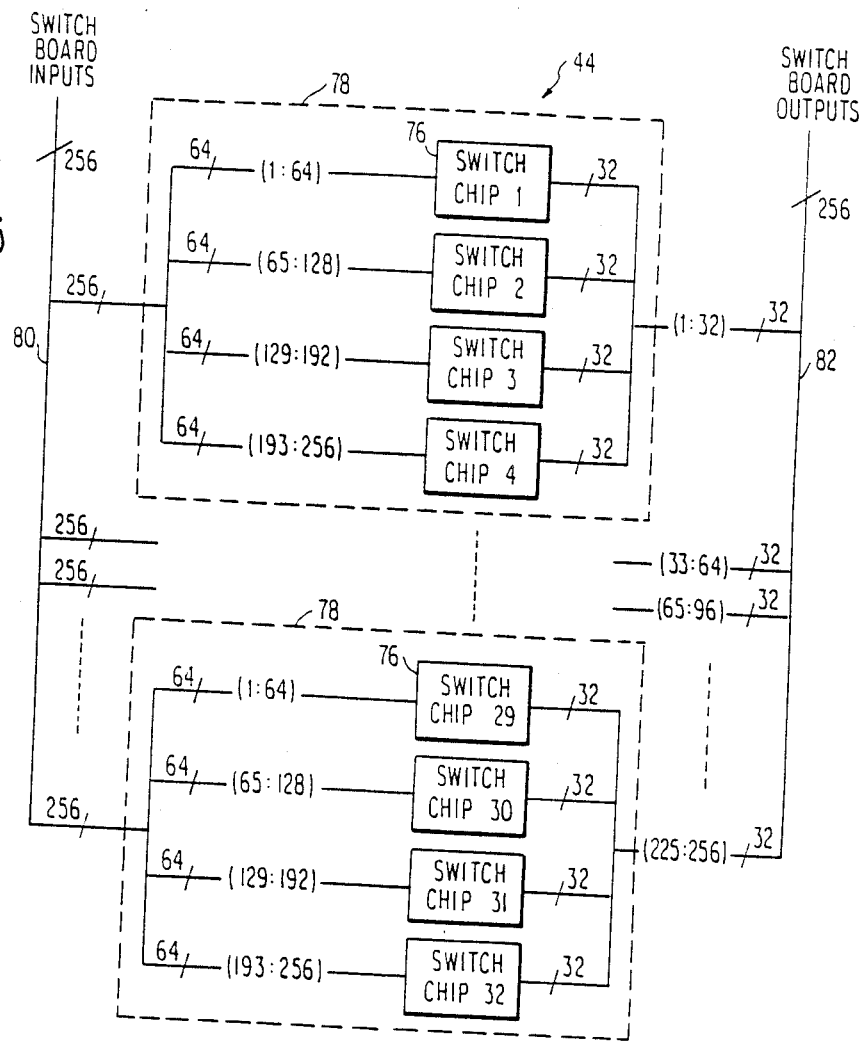
FIG. 15 is a block diagram of a first embodiment of a switch unit of FIG. 11.

Each switch unit 44 acts as a $256 \times 256$ cross-point switch connecting any of its 256 inputs to any of its 256 outputs. One preferred embodiment, illustrated in FIG. 15, includes on the board for the switch unit 44 thirty-two switch chips 76, arranged in eight groups 78 of four switch chips 76 each. Each group 78 receives all 256 inputs from a switch board input bus 80 and divides these 256 inputs into respective groups of 64 inputs to the four respective switch chips 76. The function of the switch chips 76, to be described in more detail later, is to select one of its 64 inputs for each of its 32 outputs. That is, the switch chip 76 is a 64-to-32 multiplexer. The 32 outputs are open-collector outputs so that, when the corresponding outputs of the four switch chips 76 in a group 78 are combined, any high level signal dominates. Alternatively, the four outputs could be combined in an OR gate. The combined thirty two outputs form part of a 256 bit switch board output bus 82. The switch board input and output buses 80 and 82 are connected to the pins of the switch unit 44. The switch unit 44 therefore acts as a $256 \times 256$ cross-point switch between the inputs and outputs of the switch unit 44 and allows a single input to be connected to more than one output.

Figure 16:
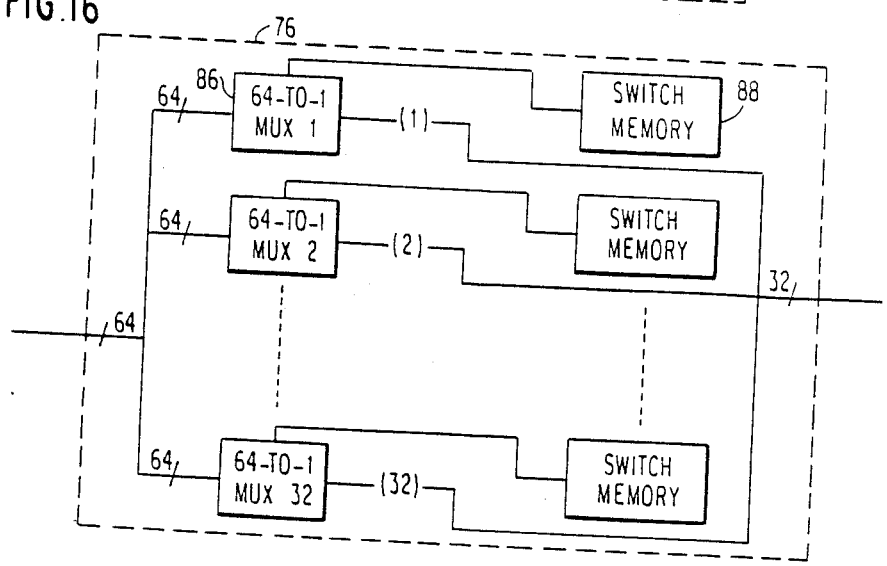
FIG. 16 is a block diagram of a switch chip of FIG. 15.

It is intended that each switch chip 76 is fabricated as an integrated circuit. Its structure is illustrated in FIG. 16 and mainly comprises thirty two 64-to-1 multiplexers 86, each with its associated switch memory 88. The 64 inputs to the switch chip 76 are fed to each of the multiplexers 86. Each multiplexer 86 selects one of its inputs as its single output. The outputs of the thirty two multiplexers 86 are combined into the thirty two bit output line of the switch chip 76. The switch chip 76 thus operates as a 64-to-32 multiplexer.

The switch memories 88 operate similarly to the instruction memories 10 of the logic chips 50. They have D locations which are sequentially accessed in synchronism with the operation of the logic units 42. Each location contains a 7-bit address to control which, if any, of the 64 inputs to the multiplexers 86 is selected as the output. The contents of the instruction memories 10 and of the switch memories 88 are loaded before the simulation begins and form a program for the simulation. Each switch memory 88 can have different contents.

The cabling between the logic units 42 and the switch units 44 presents a significant delay and the operation of the switch chips introduces a further delay. Therefore, the transfer of information between logic units 42 is pipelined through the switch units 44. That is, information output from the logic units 42 to the switch units 44 does not reappear as inputs to the logic units 42 until after several cycles of operation of the logic units 42.

The program for the simulation must be loaded into the instruction memories 10 and the switch memories 88. Furthermore, inputs externally applied to the logic circuit being simulated must be loaded into the local or switch memories 66 or 68. The results of the simulation must be read from the local or switch memories 66 or 68. To provide for such I/O, all the logic and switch chips 50 and 76 are connected to an I/O and control bus 90, shown in FIG. 11, under the direct control of the I/O and control processor 50 and the indirect control of the host computer 48. Each of the chips 50 and 76 has an identification which it recognizes. During the loading and unloading process, the I/O and control processor 50 sends an instruction containing an identifier onto the I/O and control bus 90. If the chip 50 or 76 recognizes the identifier as its identification, it processes the instruction. Otherwise, it ignores it. A loading instruction may contain an address and a data value so that the chip 50 or 76 loads the data value into the address of its memory 66, 68 or 88. For an unloading instruction, the chip 50 or 76 sends the contents of the addressed memory back onto the I/O and control bus 90. The loading process for the instruction memories 88 is similar. In this case, the data are the instructions themselves.

Figure 17:
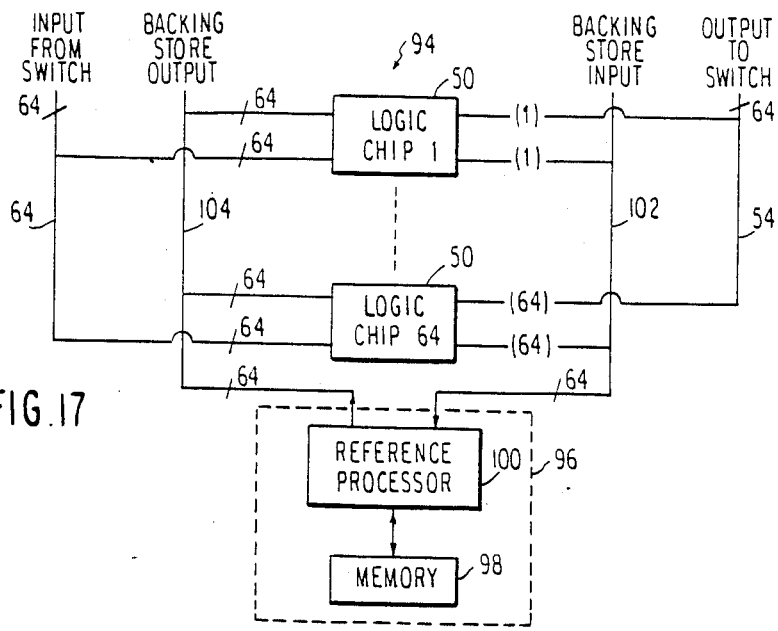
FIG. 17 is a block diagram of a backing store.

Although it is possible to simulate memory by the use of logic gates, the simulation is much more efficient if the simulation of the memory part of a circuit uses an actual memory. One way of accomplishing this, similar to the prior art, is to use one or more array units 94, illustrated in FIG. 17, in place of logic units. The array unit 94 is a modified logic unit. It contains sixty four logic chips 50, just as in the logic unit 42. Additionally, it contains an array processor 96, which comprises a memory 98 and a reference processor 100. The switch data input and output buses 54 and 64 are the same as in the logic unit 42. However, the local data bus is replaced by an array processor input bus 102 and an array processor output bus 104, each of 64 bits. The logic chips 50 simulate the production of logic signals used in controlling the memory to be simulated and of data signals to be input into that memory and puts these signals on the array processor input bus 64. The reference processor 100 converts these simulated signals into a form usable with the physical memory 98 for the same function The simulated data signals can thus be stored in the memory 98. If data is to be read from the simulated memory, the reference processor 100 reads data from the physical memory 98 and outputs it onto the array processor output bus 104. All the logic chips 50 receive the 64 bits of data on the array processor output bus 104. If desired, the reference processor 100 can contain a programmable array parameter table so that the reference processor 100 can simulate a variety of differently controlled memories with its physical memory 98. There are alternative designs for the configuration of the elements and the flow of data within the array unit 94. The choice of the design is dependent upon the details of the implementation and use of the system as a whole and is not related to the central idea of a massively distributed simulation engine.

Figure 18:
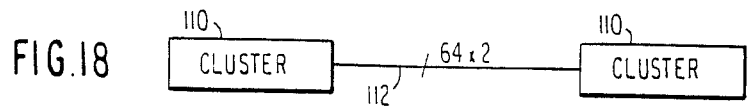
FIG. 18 is a block diagram of a two-cluster embodiment of the the invention.
Figure 19:
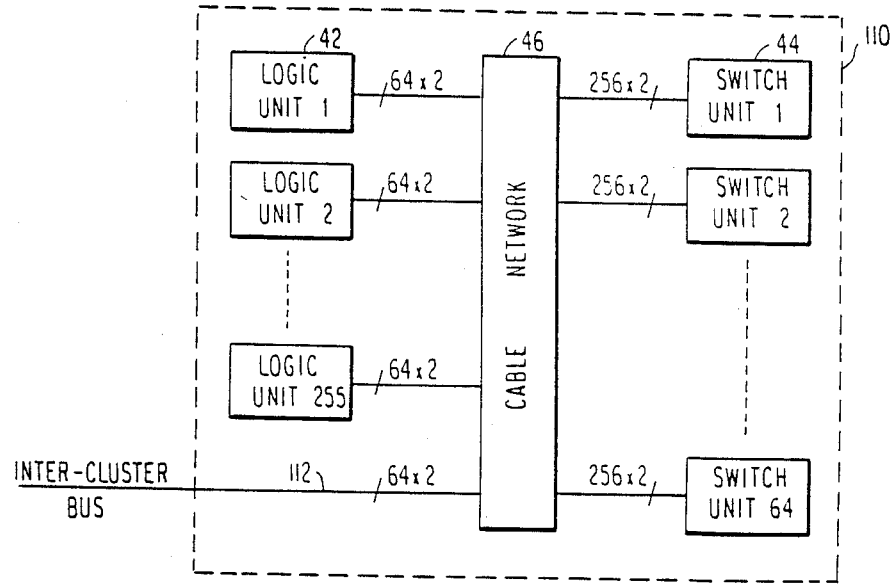
FIG. 19 is a block diagram of one cluster of a supercluster embodiment of the simulation engine of the invention.

The above discussion is directed to a two-level hierarchy of parallelism which will now be extended to a third level. The two hundred fifty six logic units 42, the sixty four switch units 44 and the cable network 46 therebetween constitute a cluster 40 in the described embodiment. The hierarchy can be extended, as illustrated in FIG. 18, in which two clusters 110 are connected by an inter-cluster bus 112. Each of the clusters 110, illustrated in FIG. 19, is a slight modification of the previously described clusters 40. Namely, one of the logic units 42 is removed and the 64x2 cable previously used as the connection to the cable network 46 is instead used as the inter-cluster bus 112. All of the logic units 42 and switch units 44 are under the control of a common I/O and control processor 50 since the timing between clusters 110 must be maintained.

In the super cluster illustrated in FIG. 18, when data is to be transmitted from a logic unit 42 of one cluster 110 to a logic unit 42 of another cluster, the data first passes through the switch units 44 of the originating cluster 110, over the inter-cluster bus 112 and through the switch units 44 of the terminating cluster 110 before arriving at the terminating logic units 42. If additional bandwidth is required between clusters 110, additional logic units 42 can be removed and the width of the inter-cluster bus 112 increased correspondingly.

Figure 20:
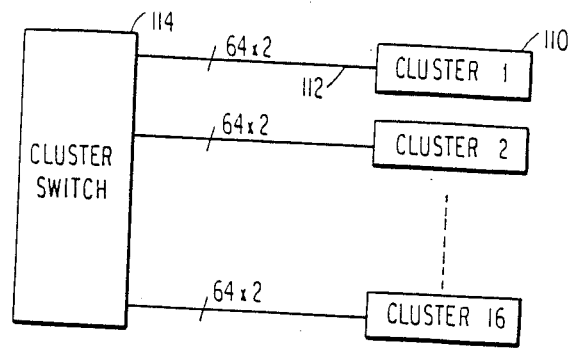
FIG. 20 is a block diagram of a larger supercluster embodiment.

If further breadth at the super-cluster level is desired, additional clusters 110 can be added. However, above about two clusters 110, the connectivity between clusters 110 becomes complex. Therefore, for significant breadth, it is preferable that a cluster switch 114 be added, as illustrated in FIG. 20, for sixteen interconnected clusters 110. The cluster switch 114 can be built in a configuration similar to that for the switch units 44 and the cable network 46 illustrated in FIG. 11 for the cluster level. Of course, the complexity is reduced because there are only 16 sets of inputs instead of the 256 sets in FIG. 11. The switch units in the cluster switch 114 would need to be programmed to perform the switching to the desired destination and its operation needs to be synchronized with all the logic units and other switch units. Of course, there is a significant pipeline delay in passing information as it passes through three switching boards and four cables.

Figure 21:
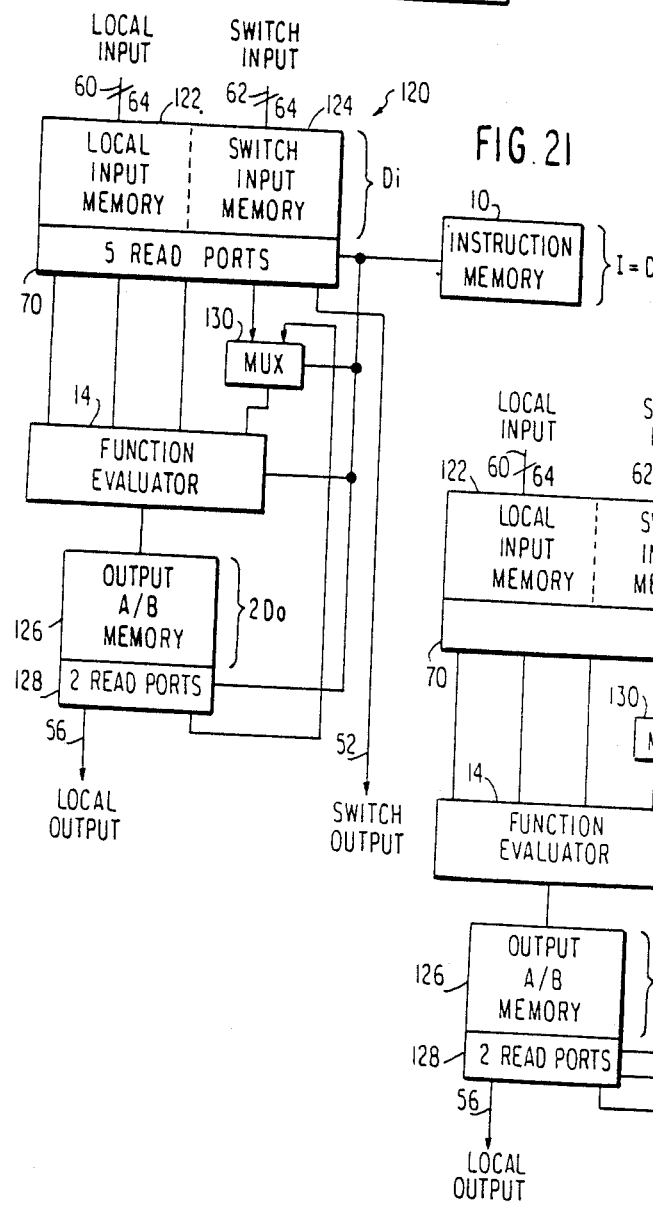
FIG. 21 is a block diagram of a second embodiment of a logic chip.

The above description of the simulation engine is logically complete. However, when it is desired to actually implement the design, further possible improvements can be made to increase the size of the simulation on the same chip areas. Possible different embodiments of the logic chip 50 will now be described. A logic chip 120, illustrated in FIG. 21, is the similar to that of FIG. 14. However, a local input memory 122 and a switch input memory 124 having a depth of $D_i$ are not divided into A/B memories and in many respects act as cache memory. The last $D_i$ values on the local and switch inputs 60 and 62 are retained in the cache. An output A/B memory 126 having a depth of $2D_o$ is written with the one output of the function evaluator 14. The contents of the output memory 126 are rewritten every two major cycles. The output A/B memory 126 has two read ports 128, one of which is connected to the local output 56 and the other is connected to one of the two inputs of a multiplexer 130 supplying one of the four inputs to the function evaluator 14. The other input of the multiplexer 130 is connected to one of the 5 read ports 70 of the local and switch input memories 122 and 124. Thereby, the values in the output memory 126 can be used in further function evaluation without being sent off chip. The depth of the instruction memory 10 is I and is equal to $D_o$ in this embodiment.

Figure 22:
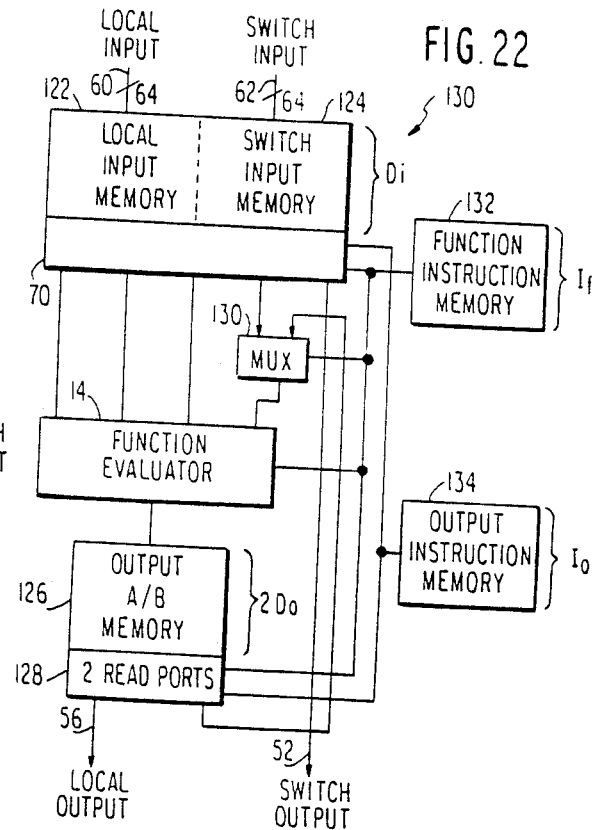
FIG. 22 is a block diagram of a third embodiment of a logic chip.

A further embodiment for a logic chip 130 is illustrated in FIG. 22 and is similar to that of FIG. 1 except that the instruction memory is divided into two parts, a function instruction memory of depth of $I_f$ and an output instruction memory 134 of depth of $I_o$, which is equal to the depth $D_o$ of the output memory 134.

The data memory requirements for the logic chip 50 of FIG. 14 is $2 \times D \times P$ bits of five-read-port RAM per chip, where P is the number of input pins on the chip (128 in the example). The instruction memory requirements are for DxW bits, where W is the width of the required instruction. The data memory requirements for the logic chips 120 and 130 of FIGS. 21 and 22 are $D_i \times P$ bits of five-read-port RAM per chip for the input memories 122 and 124 and $2 \times D_o$ bits of two-read-port RAM per chip for the output memory 126. The instruction memory requirements for the logic chip 120 is $D \times W$ bits while the logic chip 130 requires $I_f \times W_f$ bits for the function instruction memory 132 and $I_o \times W_o$ for the output instruction memory 134 where $W_f$ and $W_o$ are the respective instruction widths.

Figures 23, 24, 25, 26:
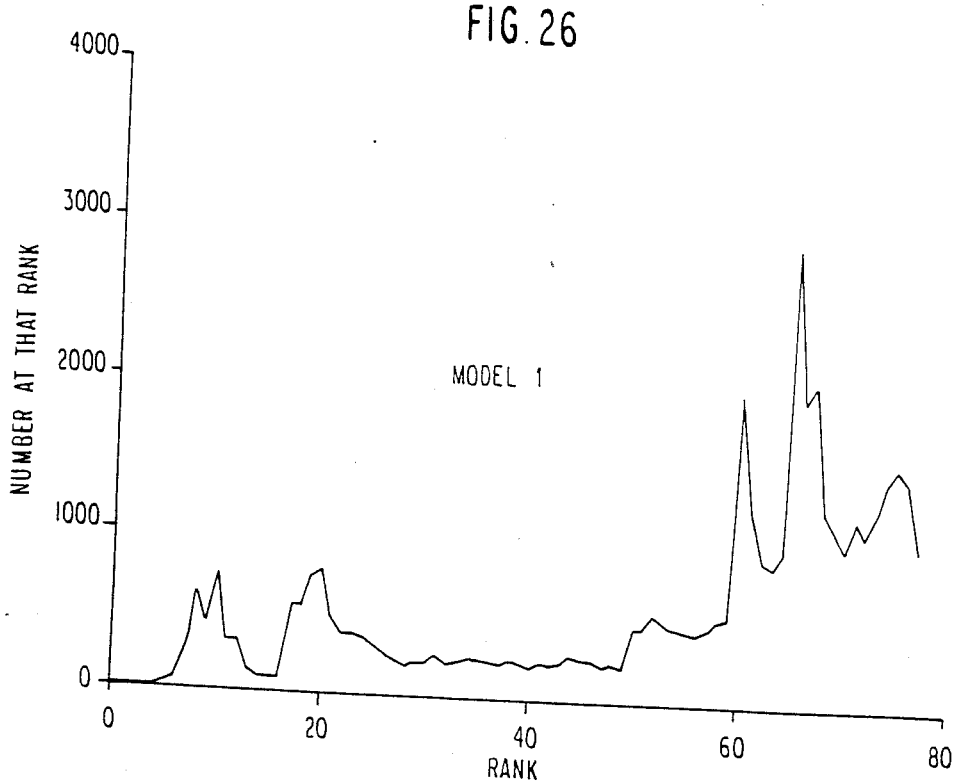
FIGS. 23, 24 and 25 are illustrations of formats of instructions for different embodiments of the logic chips.
FIGS. 26 and 27 are graphs of the distribution of rankings of instructions in two models to be simulated.

The preferred instructions are illustrated in FIGS. 23, 24 and 25 for the respective logic chips 50, 120 and 130, along with the required number of bits. There are 16 bits of the complete function table FTAB, 12 bits of a function control field, for example, interrupt conditions, and 7 bits of a WAIT field. The logic chip 50 of FIG. 14 requires four operand fields $OP_1-OP_4$ in its instruction IM for the function evaluator 14 and a fifth operand field $OP_5$ for the switch output 52. Each of the operand fields requires $7+1+d$ bits where $D=2^d$ for A/B memory. The instruction width is $W=74+5xd$. The corresponding operand fields $OP_1-OP_5$ for the logic chip 120 of FIG. 21 require only $7+i$ bits where $D_i 2^i$ but additionally requires a sixth operand field $OP_6$ for the local output of the output memory 126 having $1+o$ bits, where $D^o=2^o$. The instruction width is $W=71+5xi=o$. The logic chip 130 of FIG. 22 requires a function instruction FIM and an output instruction OIM of the form illustrated in FIG. 25. The respective instruction widths are $W_f=63+4xi$ and $W_o=8+i+o$.

The major contributions to area of the chip are the arrays used in the instruction and data memories. For yield, reliability and cost reasons, the chip should have a reasonable size, such as an 88 mm² package in CMOS, which limits the number of inputs P into the data memory to 128. For sizing estimates, it is assumed that approximately 20 mm² on the chip will be devoted to control and that an additional 20 mm² will be needed for global wiring and off-chip drivers. Thus, the area left for these memories is around 50 mm².

Consistent multiple-read-port RAM can be implemented either by duplication of a single-read-port RAM or by special design. In CMOS, a single-read-port static RAM cell can be made roughly 360 μm² per bit, so that a two-read-port RAM should be at most 720 μm² per bit and a five-read-port RAM should be at most 1800 μm² per bit. With the use of a special design, it is estimated that the cell for a two-read-port RAM could be as small as 500 μm² per bit and a five-read-port RAM cell could be as small as 1000 μm² per bit. It is assumed that an additional 5 mm² are needed per array for address-/decode; in fact, the area for address/decode should vary from about 1 mm² for a 1000 bit single-read-port RAM to roughly 6 mm² for a 64,000 bit single-read-port RAM or 8,000 bit RAM with four read ports. Also, the additional wiring is ignored which is required when a memory is implemented in two arrays.

The instruction memory is single-read-port static RAM. The number of bits per array depends upon the size and number of arrays in the data memory (see FIGS. 23-25). In a single array instruction memory of depth I and width W, the area is approximately $I \times W \times 360$ μm² plus area for address and decode logic. For example, using a single array data memory with depth 64 requires 105 bits per instruction, so the area of the array is approximately $64 \times 105 \times 360$ μm² plus area for address and decode logic. Various configurations are illustrated in Table 1 (single array data memory), Table 2 (dual array data memory) and Table 3 (dual array data an instruction memories). In Table 1, the areas are listed in units of mm² for the data memory DM and the instruction memory IM for the configuration of a single data memory and a single instruction memory. Similarly, Table 2 lists the areas in units of mm² for the input data memory IDM, the output data memory ODM and for the instruction memory IM in the case of the dual data memory. Table 3 makes the further distinction between the function instruction memory FIM and output instruction memory OIM. For the dual array instruction memory, the function instruction memory FIM has a depth $I_f$ and $W_f$ bits per instruction so the area of the array is approximately $I_f \times W_f \times 360$ μm² plus area for address and decode logic; the output instruction memory OIM has a depth $I_0$ and $W_0$ bits per instruction so the area of the array is approximately $I_0 \times W_0 \times 360$ μm² plus area for address and decode logic. The estimates assume that the single array data memory DM or the input data memory IDM is a five-read-port static RAM with 1000 μm² per bits, that the instruction memory IM, FIM or OIM is a single-read-port static RAM with 360 μm² per bit, that the output data memory is a two-read-port static RAM with 500 μm² per bit and that each array has 5 mm² for address and decode logic.

TABLE 1

| I | W | DM area | IM area | total area |
|---|---|---|---|---|
| 8 | 90 | 7.0 | 5.3 | 12.3 |
| 16 | 95 | 9.1 | 5.5 | 14.6 |
| 32 | 100 | 13.2 | 6.2 | 19.3 |
| 64 | 105 | 21.4 | 7.4 | 28.8 |
| 128 | 110 | 37.8 | 10.1 | 47.8 |
| 256 | 115 | 70.5 | 15.6 | 86.1 |
| 512 | 120 | 136.1 | 27.1 | 163.2 |
| 1024 | 125 | 267.1 | 51.1 | 318.2 |

TABLE 2

| Di | I | W | IDM AREA | ODM AREA | IM AREA | TOTAL AREA |
|---|---|---|---|---|---|---|
| 16 | 64 | 97 | 7.0 | 5.1 | 7.2 | 19.3 |
| 32 | | 102 | 9.1 | | 7.4 | 21.5 |
| 64 | | 107 | 13.2 | | 7.5 | 25.7 |
| 16 | 128 | 98 | 7.0 | 5.1 | 9.5 | 21.7 |
| 32 | | 103 | 9.1 | | 9.7 | 24.0 |
| 64 | | 108 | 3.2 | | 10.0 | 28.3 |
| 128 | | 113 | 1.4 | | 10.2 | 36.7 |
| 16 | 256 | 99 | 7.0 | 5.3 | 14.1 | 26.4 |
| 32 | | 104 | 9.1 | | 14.6 | 28.9 |
| 64 | | 109 | 13.2 | | 15.0 | 33.5 |
| 128 | | 114 | 21.4 | | 15.5 | 42.1 |
| 16 | 512 | 100 | 7.0 | 5.5 | 23.4 | 36.0 |
| 32 | | 105 | 9.1 | | 24.4 | 39.0 |
| 64 | | 110 | 13.2 | | 25.3 | 44.0 |
| 128 | | 115 | 21.4 | | 26.2 | 53.1 |
| 16 | 1024 | 101 | 7.0 | 6.0 | 42.2 | 55.3 |
| 32 | | 106 | 9.1 | | 44.1 | 59.2 |
| 64 | | 111 | 3.2 | | 45.9 | 65.1 |
| 128 | | 116 | 21.4 | | 47.8 | 75.2 |

TABLE 3

| $D_i$ | $I_f$ | $I_o$ | $W_f$ | $W_o$ | IDM area | ODM area | FIM area | OIM area | total area |
|---|---|---|---|---|---|---|---|---|---|
| 32 | 128 | 128 | 83 | 20 | 9.1 | 5.1 | 8.8 | 5.9 | 29.0 |
| 64 |  |  | 87 | 21 | 13.2 |  | 9.0 | 6.0 | 33.3 |
| 32 |  | 256 | 83 | 20 | 9.1 |  | 8.8 | 6.8 | 29.9 |
| 64 |  |  | 87 | 21 | 13.2 |  | 9.0 | 6.9 | 34.3 |
| 32 |  | 512 | 83 | 20 | 9.1 |  | 8.8 | 8.7 | 31.7 |
| 64 |  |  | 87 | 21 | 13.2 |  | 9.0 | 8.9 | 36.2 |
| 32 | 256 | 256 | 83 | 21 | 9.1 | 5.3 | 12.6 | 6.9 | 33.9 |
| 64 |  |  | 87 | 22 | 13.2 |  | 13.0 | 7.0 | 38.5 |
| 32 |  | 512 | 83 | 21 | 9.1 |  | 12.6 | 8.9 | 35.9 |
| 64 |  |  | 87 | 22 | 13.2 |  | 13.0 | 9.1 | 40.5 |
| 32 |  | 1024 | 83 | 21 | 9.1 |  | 12.6 | 12.7 | 39.7 |
| 64 |  |  | 87 | 22 | 13.2 |  | 13.0 | 13.1 | 44.6 |
| 32 | 512 | 512 | 83 | 22 | 9.1 | 5.5 | 20.3 | 9.1 | 44.0 |
| 64 |  |  | 87 | 23 | 13.2 |  | 21.0 | 9.2 | 49.0 |
| 32 |  | 1024 | 83 | 22 | 9.1 |  | 20.3 | 13.1 | 48.0 |
| 64 |  |  | 87 | 23 | 13.2 |  | 21.0 | 13.5 | 53.2 |
| 32 |  | 2048 | 83 | 22 | 9.1 |  | 20.3 | 21.2 | 56.1 |
| 64 |  |  | 87 | 23 | 13.2 |  | 21.0 | 22.0 | 61.7 |

In the single array data memory scheme, the bits in the data memory DM of depth D occupy $D \times 2 \times 128 \times 1000$ $\mu m^2$. Table 1 summarizes the estimates for D=64, 128, 256 and 512 assuming a single array instruction memory. While a depth of 64 or perhaps even 128 is feasible, more is impractical on the targeted 88 mm² package.

In the dual array data memory scheme, the size of the input data memory IDM does not scale with the number of gates per chip. Rather, it depends upon the number of data values stored per chip input $D_i$, so that the area for the bits in the input data memory IDM is $D_i \times 128 \times 1000$ $\mu m^2$. The area needed for the bits in the output data memory is $D_o \times 2 \times 500$ $\mu m^2$. Various configurations are detailed in Tables 2 and 3. For a single array instruction memory, 512 gates per chip with 32 or perhaps 64 values saved per chip input will fit on the 88 mm² package. For the dual array instruction memory, 512 gates per chip with 1024 output instructions with 32 values saved per chip input will fit on the 88 mm² package.

In a mixed-mode A/B memory simulation scheme, the input operands for each gate evaluation are specified as either the value generated on the current major cycle (the fast value) or the previous major cycle (the slow value). Fast values impose a constraint on the sequence of possible gate evaluations, since a gate can only be scheduled for evaluation after its inputs have been determined. These rank-ordered path constraints apply for the entire model and must be reflected in how the model is placed onto the machine. Thus, effective model partitioning for the massively distributed simulation engine is critical for efficient processor utilization, due to the finite bandwidth of the switch between logic units.

Since the basic simulation primitive on the simulation engine of the described embodiment is a four-input gate, it is possible that a given model will need more values sent to the switch than gates to be evaluated, depending upon how the model is partitioned; in the worst case, four times as many output instructions as evaluation instructions. With a single instruction array, the only solution is the use of dummy gate evaluation fields, i.e., no-operations, to get more switch capacity. Since there are more bits in the instruction fields to control the function evaluation than the output control, it is more efficient to use a dual array for the instruction memory and allow for more depth in the output instruction memory.

The major difference between the single and dual array data memory structures relates to the sending of values between logic chips. The single array data memory scheme provides a dedicated location for each chip input every instruction cycle, so that once a chip has received a value during any instruction cycle, it retains the value until the same instruction cycle is re-executed two major cycles later. In the dual array data memory scheme, each value received by a chip is only available for some number of instructions in the same major cycle; the depth of the input data memory determines the number of instructions the value is retained.

In the single array data memory scheme, there is no explicit specification of values to send between chips on the same logic unit, since the result of each gate evaluation is stored in all chips on the same logic unit. Values needed on other logic units are sent to the switch; fast values must be sent consistent with scheduling constraints, but slow values can be sent anytime in the major cycle after they are generated. In the dual array data memory scheme, slow values are treated in essentially the same was as fast values. Each value which is used as an input must be sent at least once on the same major cycle in which it is used as an input to all logic units which need it. For example, if a value is used F times as an input, i.e., the gate which generates that values has F fan outs, it may be necessary to send the value F times, depending upon which logic units hold these gates and which instruction cycle they are needed. It is possible that even when the gates are on the same logic unit, if the uses of the value are scheduled so that the value is lost from the input data memory, the value will have to be sent more than once.

Thus, with dual array data memory, in addition to the intrinsic partitioning problem associated with the inter-logic unit communication, there is the additional complication of sending values because of the finite depth of the input data memory. With this additional burden placed on the communication between processors, the increased communication capacity afforded by the dual array instruction memory becomes more important. Since the dual array instruction memory has decoupled the address and control of the function and output programs, the cycle time on the two arrays need not be the same, so the increased capacity is afforded in both depth and in time. That is, because the invention simulates four-input gates, the ideal configuration for the instruction memory has $I_o = 4 \times I_f$, i.e., four times as many instructions in the output instruction memory than in the function instruction memory, with the output instruction memory running four times faster than the function instruction memory.

In order to estimate the impact of dual arrays on the performance of the present invention, we have analyzed models being simulated on the prior art simulations by considering the notion of value span, the distribution of instructions, and the potential increase in maximum instruction depth caused by using the dual array data memory.

The analysis is presented for two models. The first model is a relatively small but complete System/370 CPU, including virtual logic to provide a realistic simulation environment. The second model consists of a portion of a System/370 CPU much larger than the first model. The essential structural differences between these two models are in the model size (the first model has about 43,000 instructions while the second has about 27,000), and that the first model has array accesses in its critical path. The second model is more typical of the models which we expect to be simulated on the invention but we have included the results for the first model as a "worst case".

The unpartitioned span of a value is the maximal difference in rank of the fan outs for the value. That is, if a value has F fan outs, each with rank $R_i$, $i=1, 2, \ldots F$, then the unpartitioned span is computed as:

$$\max_{i=1,F}\{R_i\} - \min_{i=1,F}\{R_i\}$$

For example, if the value of a gate evaluated at rank 15 is used as input by gates at rank 20, 22 and 26, then the un-partitioned span is $26-20=6$. The partitioned span of a value is similar, except that instead of using rank, instruction memory location is used.

Span provides a measure of cache misses, in that every gate which has a span longer than the depth of the input data memory is guaranteed to cause at least one input data memory overflow. Unpartitioned span provides a measure of critical paths in the model, regardless of how efficiently it can be partitioned. Partitioned span shows how effectively a given partitioning algorithm works on a given model.

The cache span of a value is defined as the lifetime of the value in the input data memory, i.e., the location of the value when it is last referenced. Cache span predicts how many values must be sent more than once due to finite depth of the input data memory; ideally, the disruption of cache span should cut off before the end of the cache. A related measure is the first usage in the input data memory. Ideally, this should be 1, but having a finite number of send instructions per cycle causes this to increase as values are sent earlier than needed.

In performing the analysis, the models were partitioned into various numbers of logic units and input data memory depths. The results shown here were for eight logic units. The analysis procedure was performed as follows.

First, a register transfer description of the model was converted into a Boolean gate description by a parser and then an optimizer attempted to reduce the number of gates. These steps were performed using tools best fitted for the prior art simulation engines and are probably not the best ones for the present invention. For instance, the optimizer did not have any optimizations to specifically reduce the long zero-delay paths produced by the parser but only packs into a relatively small number (less than 20) of different four input functions with free inversions.

Figure 27:
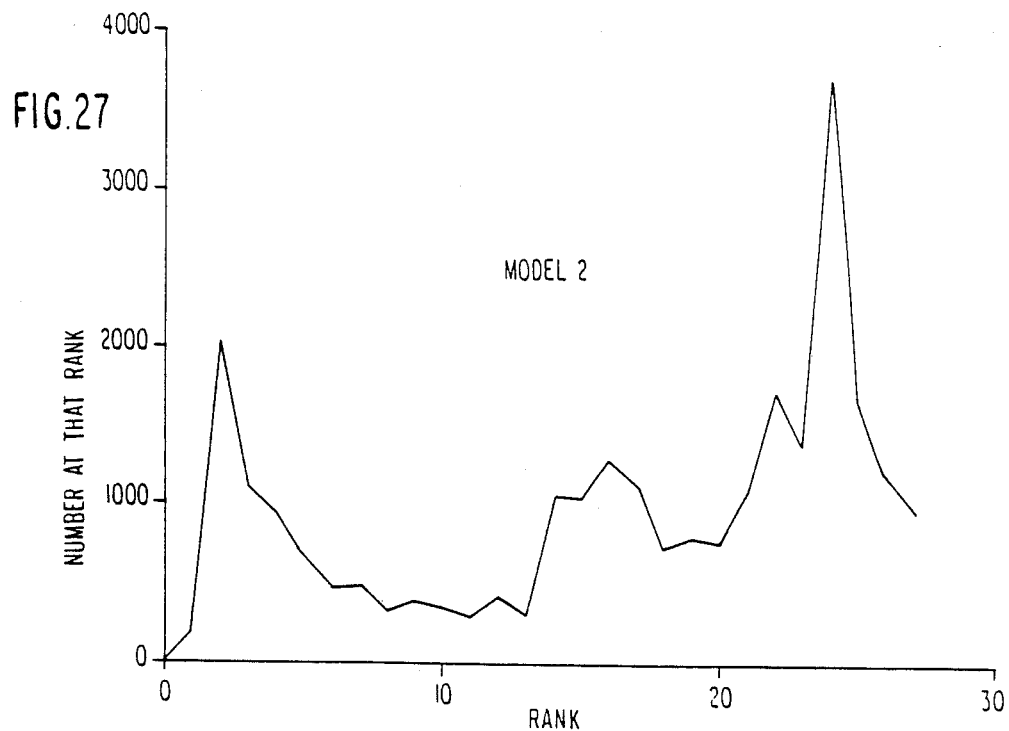
Figure 28:
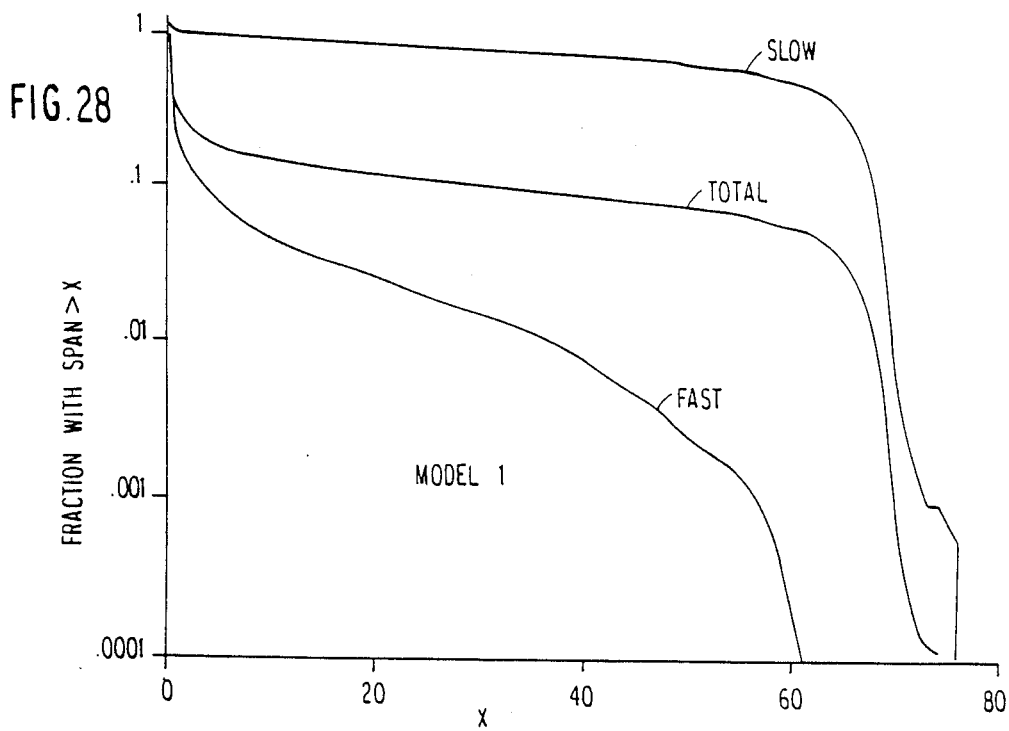

Then the file produced in the first step was parsed and each gate was assigned a rank consistent with the fast signals. The ranks are shown in FIG. 26 for the first model and FIG. 27 for the second model. The ports for the arrays were treated as high fan-in gates, with port priority giving an additional ranking constraint. The unpartitioned span was then determined for all gates. The resultant span distributions are shown in FIG. 28 for the first model and FIG. 29 for the second model.

After the ranks were established, the models were partitioned for the different logic units by back-tracing the cones of influence of each output, using a six cycle pipeline delay between logic units and ignoring array partitioning and switch scheduling. Each gate was then assigned to a location in the function instruction memory of a logic chip, attempting to place gates on the same logic chip as one of their predecessors whenever possible. The overall partitioning efficiency was about 50%, meaning that roughly one half of the function evaluation instructions would be used.

The instructions in the output instruction memories were determined by computing the number of signals to be sent locally and globally, assuming that a values is sent as late as possible and still arrive in time to be used. Two cases were considered. The first case, called single-cycle, assumed that the cycle time on the two instruction arrays was the same. In the second case, called the dual-cycle case, the cycle time of the output instruction memory was twice as fast as the function instruction memory. In both cases, if there was an overflow in the number of values received per function evaluation cycle (64 for the single-cycle case, 128 for the dual-cycle case), then an attempt was made to push the sending of the values to an earlier cycle, a process called smoothing. The procedure did not attempt to correct the initial partition or function instruction memory load based on results of the output instruction memory load.

Figure 31:
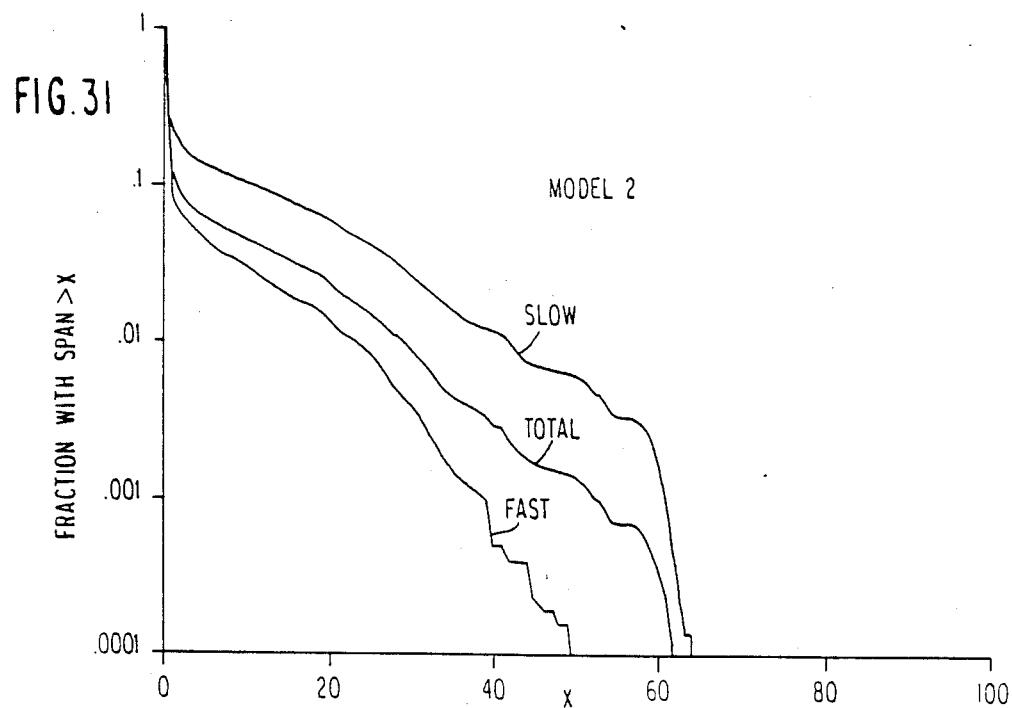

For those levels which had received overflows, extra cycles were inserted. The procedure started at the top of the instruction memory and, for each overflow, the procedure inserted a level and repeated the above procedure for determining the instructions for the output instruction by computing the number of locally and globally sent signals. When there were no more overflows, the partitioned span was determined. The distributions for the partitioned span are shown in FIG. 30 for the first model and in FIG. 31 for the second model. For the first model, the maximum depth was 230 for the single-cycle case and 203 for the dual-cycle case. For the second model, the corresponding depths were 114 and 93. For the dual-cycle case, only one level (due to global receives) needed to be inserted for the second model and none were needed for the first model. The single-cycle case required about 15% to 20% more output instruction levels, due almost entirely to local receives. These extra levels were needed to receive data from the arrays and would have to be added for a single data memory chip as well. Other models which did not have arrays did not have a significant number of overflows even for the single-cycle case.

Figure 32:
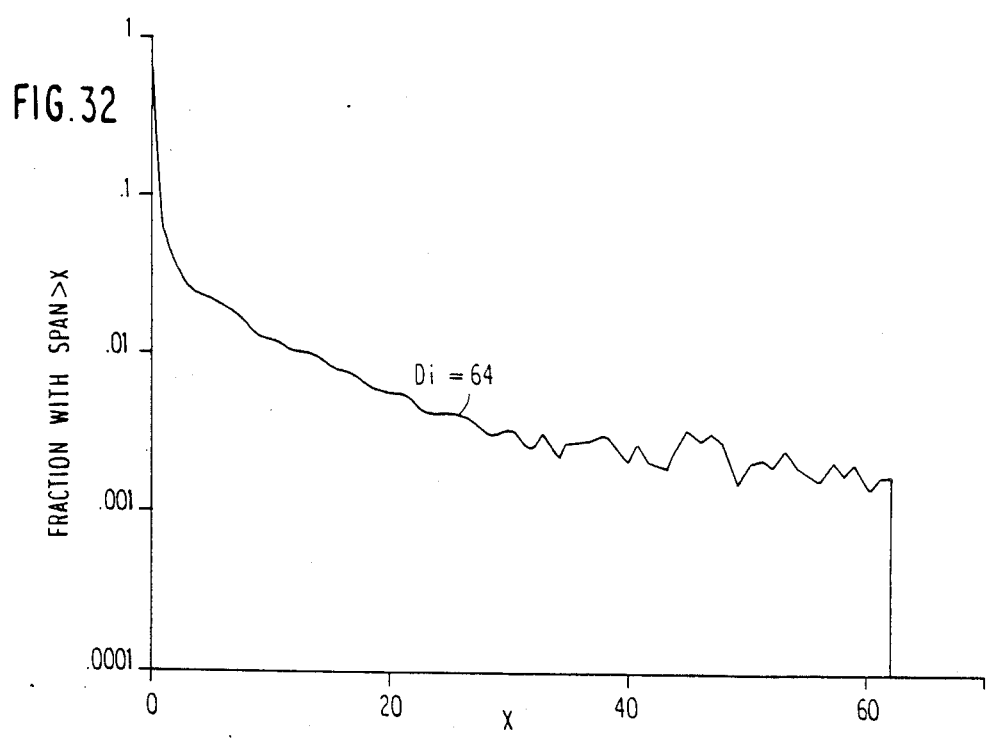
FIGS. 32 and 33 are graphs of the cache span for the two models.
Figure 33:
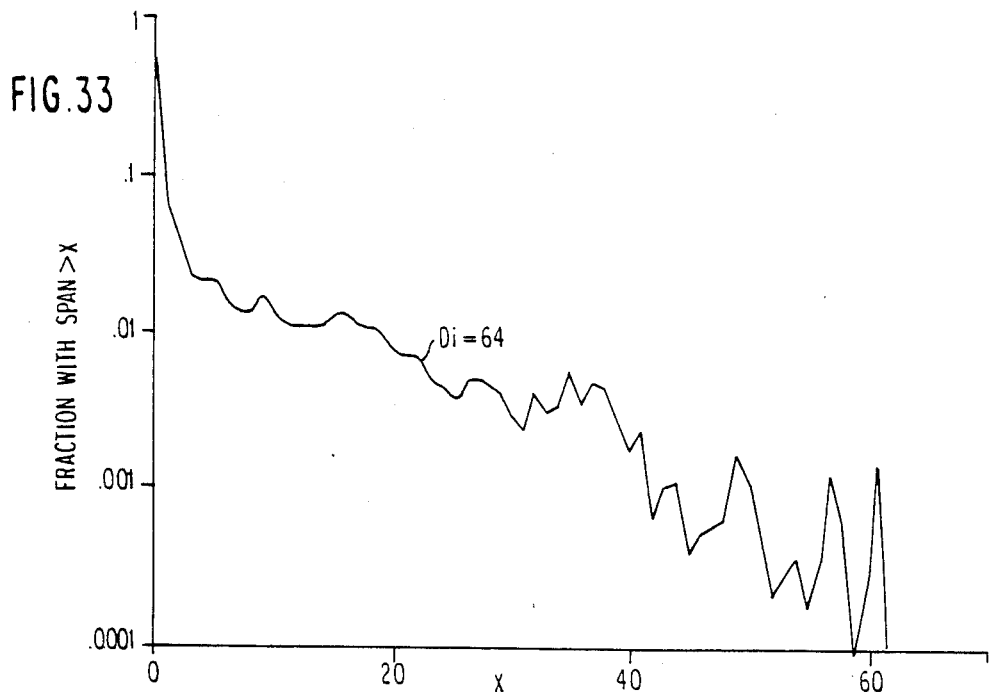

Finally, the cache span for the model was determined. FIG. 32 shows the distribution for the cumulative cache span for the first model and FIG. 33 shows it for the second model. The illustrated spans were for an input data memory depth of $D_i=64$. The curves for an input depth of $D_i=32$ closely followed the illustrated curves except for abruptly falling to zero at a span of 30. This data show that the overall impact of a finite depth input data memory is small. The cache span drops off rapidly and the difference between 32 and 64 is marginal. For the equal cycle time case, for example, in both models there was virtually no difference in the cache span up to a depth of 32.

Therefore, the analysis indicates that an input data memory depth of 32 is probably just as good as 64. Moreover, the extra communication depth and time capacity of the dual instruction memory scheme is needed to minimize the impact of array accesses.

Variant embodiments of the switch unit will now be described. The switch unit previously described was a 256×256 cross-point switch. The previously described embodiment implemented this with switch chips designed as 64-to-32 multiplexers with memory local to the switch chip to control the program for the multiplexer, that is, the switch instruction memory. Then 32 switch chips were used for the switch unit. Other possible multiplexer combinations are possible.

Figure 34:
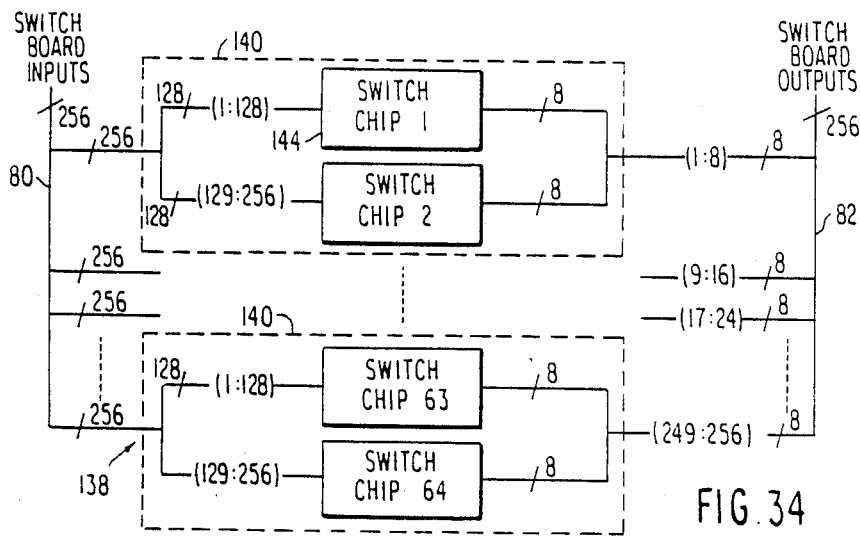
FIG. 34 is a block diagram of a second embodiment of a switch unit.

For example, if the switch chip implements a 128-to-8 multiplexer, then each switch unit will need 64 switch chips. This embodiment of a switch unit 138 is illustrated in FIG. 34 and consists of 32 pairs of two switch chips 144 each. Each switch chip 144 is a 128-to-8 multiplexer and receives half of the 256 switch board inputs. The 8 outputs of the two switch chips 144 constituting a pair 140 are connected together in an open-collector configuration and contribute 8 of the 256 switch board outputs. The general configuration resembles that of the switch unit 44 of FIG. 15.

The depth of the output instruction memory 134 of FIG. 22 is $I_o$ and is equal to the depth $I_s$ of the switch memory 88 of FIG. 16, which is applicable to the switch unit 140 of FIG. 34 as well. Then, in this last embodiment, each switch chip 144 would need $8 \times 8 \times I_s$ bits to hold the switch program.

Figure 35:
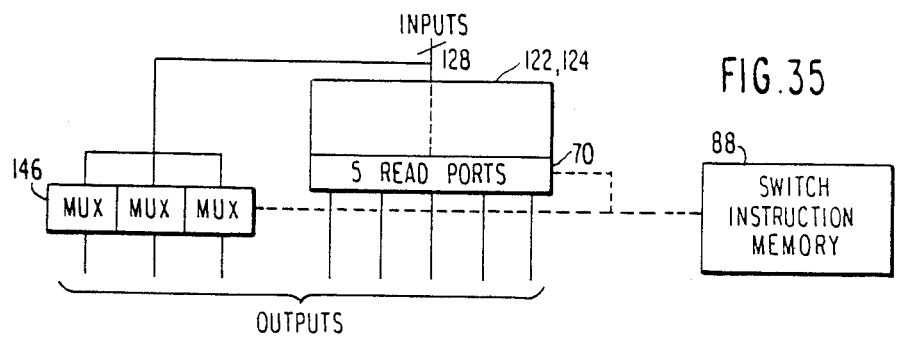
FIG. 35 is a block diagram of a fourth embodiment of a logic chip.

The logic chip 130 of FIG. 22 has 128 inputs and roughly the same amount of instruction memory in its two instruction memories 132 and 134 as would be needed for the switch instruction memory 88. For example, if there are 512 instructions i the function instruction memory 132 (roughly 22,500 bits), then there is a total of about 65,000 of static RAM per logic chip 130 and $8 \times 8 \times 1024$ (roughly 65,000 bits) are needed in the switch instruction memory 88 on the switch chip 144. Thus, by making modifications to the address and decode logic for the logic chip instruction memories, the logic chip 130 can be modified to be used as the switch chip 144 of FIG. 35 by adding three additional multiplexers 146 and providing six additional chip outputs for a total of eight outputs. The 5 read ports 70 are modified so that they always access from the first location of the input data memories 122 and 124.

The design for a dual instruction memory 132 and 134 in the logic chip 130 of FIG. 22 is advantageous because with a single instruction memory 10 in FIGS. 14 and 21, assuming a total of 512 instructions (approximately 54,000 bits), there is a 50% mismatch in the amount of RAM needed to build a switch chip with with a switch memory instruction depth of 512 (roughly 37,000 bits).

The above analysis shows that the dual instruction memory allows for more switch capacity than could be obtained when a single instruction memory is used. Also, the dual array data memory increases the maximum number of gates which can be simulated per cluster.

It has been shown that dual arrays should have minor performance impact in the sense that any model which runs on a simulation engine with single array logic chips will also run with dual array logic chips with essentially the same performance. However, for the same number of clusters, a dual array simulation engine will simulate larger models than is possible with a single array engine Thus, from a cost perspective, when capacity is more important than speed, performance can be traded for capacity and fewer clusters can be used to contain the same size models. For example, a two-cluster engine using dual arrays with 512 instructions per chip would have the same capacity but one-eighth the performance and cost of an eight-cluster engine built using single data memory logic chips with 64 instructions, assuming that both were run at full depth.

What is claimed is:

1. A simulation engine, comprising:

a plurality of high level logic processors operating in parallel, each high level logic processor having an input bus of multiple lines and an output bus of multiple lines; and a switching system for simultaneously connecting selected multiple ones of said input buses with selected multiple ones of said output buses;

wherein each of aid high level logic processors comprises a plurality of low level logic processors operating in parallel, each low level logic processor receiving input data values on all lines of said input bus of said high level logic processor of which said low level logic processor is part and providing a signal to less than all lines of said output bus of said high level logic processor of which said low level logic processor is part, each low level logic processor comprising an instruction memory containing a plurality of instructions and a function evaluator for logically combining selected ones of said input data values according to a selected one of a plural logic function, each said instruction in said instruction memory defining said selected ones of said input data values and said selected logic function.

2. A simulation engine as recited in claim 1, wherein each said high level logic processor additionally comprises a local data bus of multiple lines, each low level logic processor in said each high level logic processor receiving local data values on all of said multiple lines of said local data bus and providing a signal to less than all of said multiple lines of said local data bus, said function evaluator logically combining selected ones of said input data values and local data values, each said instruction in said instruction memory defining said selected ones of said input and local data values.

3. A simulation engine, comprising:

a plurality of logic units, each of said logic units having a plurality of input terminals and a plurality of output terminals;

a plurality of switch units, each of said switch units comprising a switch memory, a plurality of input terminals and a plurality of output terminals, each location in said switch memory indicating a selective connection between one of said input terminals and one of said output terminals; and a cabling network between said switch units and said logic units, wherein said cabling network connects input and output terminals of each respective one of said logic units with respective output and input terminals of each of said switch units;

wherein each of said logic units comprises a plurality of logic chips, an input bus connecting first inputs of said logic chips with said input terminals of said each logic unit, an output bus connecting first outputs of said said logic chips with said output terminals of said each logic unit, and a local bus connecting at least one second output of all of said logic chips of said each logic unit with second inputs of said all logic chips, each of said logic chips executing a program at each step of which a plurality of values received on said first and second inputs of said each logic chip are logically combined according to a selected function of said each step.

4. A simulation engine as recited in claim 3, wherein each of said logic chips comprises:

an input memory receiving said first and second inputs;

an instruction memory having stored therein a plurality of instructions, each instruction comprising an operation identifier and operand identifiers;

a plurality of read ports for reading from said input memory a plurality of data identified by said operand identifiers;

a function evaluator for logically combining said plurality of read data according to said operation identifier, an output of said function evaluator being connected to one of said first and second outputs of said each logic chip.

5. A simulation engine as recited in claim 4, wherein each of said logic chips is fabricated on a separate integrated circuit.

6. A simulation engine as recited in claim 4, wherein each of said logic chips further comprises:
an output memory for storing sequentially generated values of said output of said function evaluator in sequential locations thereof; and
at least one read port for reading from said output memory a selected one of said values stored therein and addressed by an output identifier contained in each of said instructions in said instruction memory.

7. A simulation engine as recited in claim 6, wherein an output of said output memory is connected to said local bus and an output of one of said read ports for said input memory is connected to said output bus.

8. A simulation engine as recited in claim 4, wherein each of said logic chips further comprises:
an output memory for storing sequentially generated values of said output of said function evaluator in sequential locations thereof and wherein said input memory stores sequential ones of data values on said input bus and on said local bus in sequential locations thereof;
at least one read port for reading from said output memory selected data values stored therein;
wherein said instruction memory is a first instruction memory part having a first plurality of said instructions stored therein;
and further comprising a second instruction memory part having a second plurality, greater than said first plurality, of second instructions stored therein for controlling said at least one read port for reading from said output memory.

9. A simulation engine as recited in claim 8, wherein each of said logic chips further comprises an additional read port for reading said input memory according to a sequential one of said second instructions and having an output connected to said output bus.

10. A simulation engine as recited in claim 3, comprising a plurality of clusters and a cluster switch network for passing data between any of said clusters, wherein each of said clusters comprises respective sets of said plurality of logic units, said plurality of switch units and said cabling network and wherein said cluster switch network is connected to said input and output terminals of said switch units in each of said clusters.

11. A logic simulation unit, comprising:
an input memory containing a first plurality of locations and receiving in parallel a second plurality of inputs;
a third plurality of first read ports for simultaneously reading data from a third plurality of locations in said input memory addressed by a third plurality of first addresses;
a function evaluator for logically combining a plurality of data, at least some of which are provided by said first read ports, according to a selected one of a plurality of function identifiers;
an output memory receiving sequential outputs of said function evaluator in sequential locations thereof, said output memory having a fourth plurality of said sequential locations, said fourth plurality being less than said third plurality;
a second read port for reading a data value from one of said locations of said output memory according to a second address; and
an instruction memory containing a plurality of sequentially accessed instructions, said instructions containing said first addresses, said second address and said function identifiers.

12. A logic simulation unit as recited in claim 11, wherein said instruction memory comprises a function memory part and an output memory part having a greater number of addressed locations than said function memory part, said function memory part containing a plurality of first instructions, each containing said first addresses and said function identifier, said output memory part containing a plurality of second instructions, each containing a second address.

* * * * *